US006606023B2

(12) United States Patent
Chiang et al.

(10) Patent No.: US 6,606,023 B2
(45) **Date of Patent: *Aug. 12, 2003**

(54) ELECTRICAL DEVICES

(75) Inventors: Justin Chiang, Newark, CA (US); Shou-Mean Fang, Shanghai (CN); William C. Beadling, San Jose, CA (US)

(73) Assignee: Tyco Electronics Corporation, Middletown, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,278

(22) Filed: Apr. 14, 1998

(65) Prior Publication Data

US 2002/0050914 A1 May 2, 2002

(51) Int. Cl.$^{7}$ .................................................. H01L 7/13

(52) U.S. Cl. ..................... 338/22 R; 338/320; 338/328; 338/260; 338/313; 338/314

(58) Field of Search .............................. 338/22 R, 225, 338/313, 332, 328, 312, 314, 320, 260, 239, 295

(56) References Cited

U.S. PATENT DOCUMENTS 4,237,441 A 12/1980 van Konynenburg et al. ................ 338/22 R (List continued on next page.)

FOREIGN PATENT DOCUMENTS

| | | |
|---|---|---|
| EP | 0 790 625 A2 | 8/1987 |
| WO | WO 94/01876 | 1/1994 |
| WO | WO 95/34084 | 12/1995 |
| WO | WO 98/12715 | 3/1998 |
| WO | WO 98/29879 | 7/1998 |

OTHER PUBLICATIONS

Sunahara abstract to JP 404150001A (May 1992).*

(List continued on next page.)

*Primary Examiner*—Karl D. Easthom

(57) ABSTRACT

A composite circuit protection device includes a laminar insulating member and first and second laminar circuit protection devices. Each of the first and second laminar circuit protection devices includes (1) a first laminar electrode, (2) a second laminar electrode, (3) a laminar PTC resistive element which (i) exhibits PTC behavior, (ii) has a first face to which the first electrode is secured and an opposite second face to which the second electrode is secured, and (iii) defines first and second apertures which run between the first and second faces, (4) a third laminar conductive member which (i) is secured to the second face of the PTC resistive element in the area of the first aperture, and (ii) is spaced apart from the second electrode, (5) a fourth laminar conductive member which (i) is secured to the first face of the PTC resistive element in the area of the second aperture, and (ii) is spaced apart from the first electrode, (6) a first transverse conductive member which lies within the first aperture defined by the PTC resistive element, runs between the first and second faces of the PTC element, is secured to the PTC element, and is physically and electrically connected to the first laminar electrode and to the third laminar conductive member, but is not connected to the second laminar electrode, and (7) a second transverse conductive member which lies within the second aperture defined by the PTC resistive element, runs between the first and second faces of the PTC element, is secured to the PTC element, and is physically and electrically connected to the second laminar electrode and to the fourth laminar conductive member, but is not connected to the first laminar electrode. The first and second laminar devices are physically secured together in a stacked configuration, with the laminar insulating member between them; and the devices are connected together electrically by interfacial electrical connections between adjacent electrodes and laminar conductive members so that when an electrical power supply is connected to (i) one of the electrodes and (ii) the third or fourth laminar member on the same face of the PTC resistive element as the electrode (i), the first and second laminar circuit protection devices are connected electrically in parallel.

13 Claims, 3 Drawing Sheets

U.S. PATENT DOCUMENTS

| | | | | | |
|---|---|---|---|---|---|
| 4,304,987 | A | | 12/1981 | van Konynenburg | 219/553 |
| 4,388,607 | A | | 6/1983 | Toy et al. | 338/22 SD |
| 4,514,620 | A | | 4/1985 | Cheng et al. | 219/553 |
| 4,534,889 | A | | 8/1985 | van Konynenburg et al. | 252/511 |
| 4,545,926 | A | | 10/1985 | Fouts et al. | 252/511 |
| 4,560,498 | A | | 12/1985 | Horsma et al. | 252/511 |
| 4,591,700 | A | | 5/1986 | Sopory | 219/505 |
| 4,689,475 | A | | 8/1987 | Matthiesen | 219/553 |
| 4,724,417 | A | | 2/1988 | Au et al. | 338/22 R |
| 4,774,024 | A | | 9/1988 | Deep et al. | 252/511 |
| 4,800,253 | A | | 1/1989 | Kleiner et al. | 219/553 |
| 4,935,156 | A | | 6/1990 | van Konynenburg | 219/553 |
| 5,049,850 | A | | 9/1991 | Evans et al. | 338/22 R |
| 5,166,658 | A | * | 11/1992 | Fang et al. | 338/23 |
| 5,378,407 | A | | 1/1995 | Chandler et al. | 252/513 |
| 5,382,938 | A | * | 1/1995 | Hansson et al. | 338/22 R |
| 5,451,919 | A | | 9/1995 | Chu et al. | 338/22 R |
| 5,488,348 | A | * | 1/1996 | Asida et al. | 338/22 R |
| 5,582,770 | A | | 12/1996 | Chu et al. | 252/511 |
| 5,747,147 | A | | 5/1998 | Wartenberg et al. | 428/209 |
| 5,777,541 | A | * | 7/1998 | Vekeman | 338/22 R |
| 5,801,612 | A | | 9/1998 | Chandler et al. | 338/22 R |
| 5,818,676 | A | * | 10/1998 | Gronowicz, Jr. | 338/22 R |
| 5,831,510 | A | * | 11/1998 | Zhang et al. | 338/22 R |
| 5,852,397 | A | * | 12/1998 | Chan et al. | 338/22 R |
| 5,864,281 | A | | 1/1999 | Zhang et al. | 338/22 R |
| 5,907,273 | A | * | 5/1999 | Ross, Jr. et al. | 338/313 |
| 6,020,808 | A | | 2/2000 | Hogge | 338/22 R |
| 6,172,591 | B1 | | 1/2001 | Barrett | 338/22 R |

OTHER PUBLICATIONS

International Written Opinion for International Application No. PCT/US99/08195 dated Oct. 27, 2000.

Patent Abstracts of Japan, vol. 013, No. 198 (E–756), May 11, 1989 & JP 01–020601A (JCG Corp.), Jan. 24, 1989, abstract.

U.S. patent application No. 08/798,887, Toth et al, filed Feb. 10, 1997.

U.S. patent application No. 08/816,471, Chandler et al, filed Mar. 13, 1997.

U.S. patent application No. 08/900,887, Chu et al, filed Jul. 25, 1997.

* cited by examiner

ELECTRICAL DEVICES

CROSS REFERENCE TO RELATED APPLICATIONS

This application is related to commonly assigned U.S. patent application Ser. No. 08/900,787 filed Jul. 25, 1997 by Graves, Zhang, Chandler, Chan, Fang, Beadling, Siden and Thompson, now U.S. Pat. No. 5,825,397, issued Dec. 22, 1999. Ser. No. 08/900,787 is a continuation of U.S. patent application Ser. No. 08/727,869 filed Oct. 8, 1996, now abandoned, which is a continuation of U.S. patent application Ser. No. 08/302,138, filed Sep. 7, 1994, now abandoned, which is a continuation-in-part of (1) commonly assigned U.S. patent application Ser. No. 08/152,070, filed Nov. 12, 1993, by Graves, Zhang, Chandler, Chan and Fang, now abandoned, which is a file wrapper continuation of U.S. patent application Ser. No. 07/910,950, filed Jul. 9, 1992, now abandoned, and (2) commonly assigned U.S. patent application Ser. No. 08/121,717, filed Sep. 15, 1993, by Fang, Siden, Thompson and Zhang, now abandoned. This application is also related to International Application No. PCT/US93/06480, filed Jul. 8, 1993, by Raychem Corporation, now published as WO 94/01876, which claims priority from U.S. patent application Ser. No. 07/910,950; to commonly assigned U.S. patent application Ser. No. 08/242,916, filed May 16, 1994, by Zhang and Fang, now abandoned in favor of continuation application Ser. No. 08/710,925, now U.S. Pat. No. 5,831,510, issued Nov. 3, 1998, and to commonly assigned U.S. patent application Ser. No. 08/257,586, filed Jun. 9, 1994, by Zhang, Thompson, Toth and Beadling, now abandoned in favor of continuation application Ser. No. 08/808,135, now U.S. Pat. No. 5,864,281, issued Jan. 26, 1999.

BACKGROUND OF THE INVENTION

1. Field of the Invention

This invention relates to electrical devices.

2. Introduction to the Invention

Ser. No. 08/121,717 and its published International counterpart WO 94/01876 disclose circuit protection devices which comprise first and second laminar electrodes; a laminar PTC resistive element sandwiched between the electrodes; a third laminar conductive member which is secured to the same face of the PTC element as the second electrode but is separated therefrom; and a cross-conductor which passes through an aperture in the PTC element and connects the third conductive member and the first electrode. This permits connection to both electrodes from the same side of the device, so that the device can be connected flat on a printed circuit board, with the first electrode on top, without any need for leads. The resistive element preferably comprises a laminar element composed of a PTC conductive polymer. Preferably the device comprises an additional conductive member and an additional cross-conductor, so that the device is symmetrical and can be placed either way up on a circuit board. Ser. No. 08/242,916 and its published International counterpart WO 95/31816 describe improved devices of the kind described in Ser. No. 08/121,717 which include insulating members which prevent solder bridges between the conductive member and the adjacent electrode. Ser. No. 08/257,586 and its published International counterpart WO 95/34084 describe an improved method of making such devices. The entire disclosure of each of those U.S. applications and International Publications is incorporated herein by reference for all purposes.

SUMMARY OF THE INVENTION

There is a demand for circuit protection devices which occupy a very small area on a circuit board and which have a lower resistance than can be conveniently produced by the known methods. We have discovered, in accordance with the present invention, that two or more of the symmetrical devices described in Ser. No. 08/121,717 International Publication No. and WO 94/01876 can be easily and economically connected together to make a composite circuit protection device which is easy to install and which has lower resistance per unit area than the individual devices.

The composite protection devices of the invention comprise (A) a laminar insulating member;

(B) a first laminar circuit protection device; and (C) a second laminar circuit protection device;

each of the first and second laminar circuit protection devices comprising (1) a first laminar electrode;

(2) a second laminar electrode;

(3) a laminar PTC resistive element which (i) exhibits PTC behavior, (ii) has a first face to which the first electrode is secured and an opposite second face to which the second electrode is secured, and (iii) defines first and second apertures which run between the first and second faces;

(4) a third laminar conductive member which (i) is secured to the second face of the PTC resistive element in the area of the first aperture, and (ii) is spaced apart from the second electrode;

(5) a fourth laminar conductive member which (i) is secured to the first face of the PTC resistive element in the area of the second aperture, and (ii) is spaced apart from the first electrode;

(6) a first transverse conductive member which
- (a) lies within the first aperture defined by the PTC resistive element,
- (b) runs between the first and second faces of the PTC element,
- (c) is secured to the PTC element, and
- (d) is physically and electrically connected to the first laminar electrode and to the third laminar conductive member, but is not connected to the second laminar electrode; and (7) a second transverse conductive member which
- (a) lies within the second aperture defined by the PTC resistive element,
- (b) runs between the first and second faces of the PTC element,
- (c) is secured to the PTC element, and
- (d) is physically and electrically connected to the second laminar electrode and to the fourth laminar conductive member, but is not connected to the first laminar electrode;

the first and second laminar devices being physically secured together in a stacked configuration, with the laminar insulating member between them; and the devices being connected together electrically by interfacial electrical connections between adjacent electrodes and laminar conductive members so that when an electrical power supply is connected to (i) one of the electrodes and (ii) the third or fourth laminar member on the same face of the PTC resistive element as the electrode (i), the first and second laminar circuit protection devices are connected electrically in parallel.

In addition to the advantages set out above we have found that the power dissipation of such a composite device is not substantially different from the power dissipation of one of the devices alone. As a result, the composite device has a lower resistance for a given hold current ("hold current" is the largest current which can be passed through a device without causing it to trip). Furthermore, by appropriate sorting of the individual devices before they are assembled into composite devices, variations within a batch of composite devices can be reduced.

BRIEF DESCRIPTION OF THE DRAWINGS

The invention is illustrated in the accompanying drawings, in which.

DETAILED DESCRIPTION OF THE INVENTION

Figure 1:
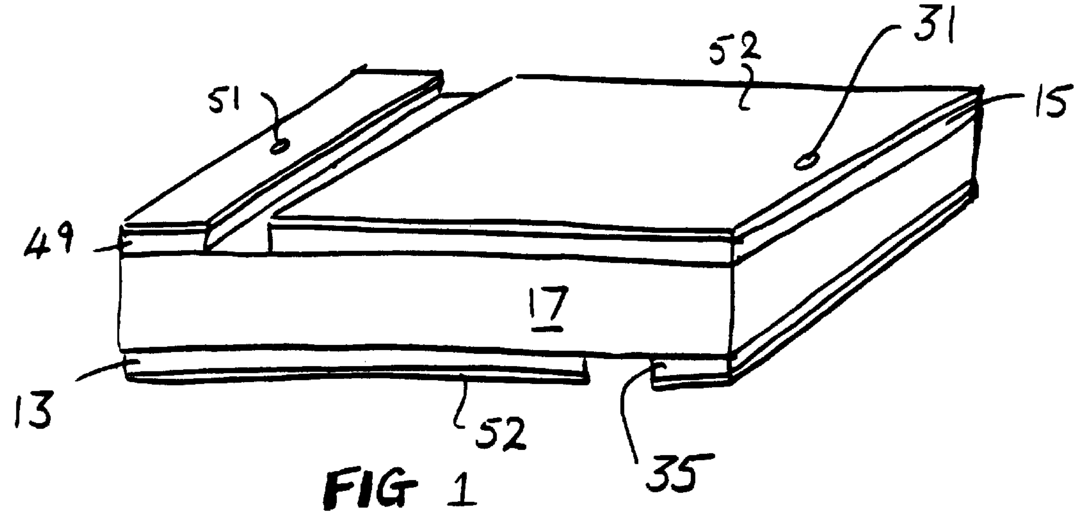
FIG. 1 is a perspective view of a laminar circuit protection device suitable for use in a composite circuit protection device of the invention.

The composite circuit protection device of the invention comprises a laminar insulating layer and at least two laminar circuit protection devices, i.e. first and second circuit protection devices. The first and second circuit protection devices can be substantially identical, or they can be different. For example, the first and second devices can have different shapes (so long as they can be physically connected and electrical connection can be adequately made) or different thicknesses or can comprise different types of resistive elements, as described below. In one embodiment, the composite device can comprise a plurality of circuit protection devices, i.e. three or more laminar circuit protection devices. For ease of assembly it is preferred that the plurality of devices be substantially identical.

PTC Compositions

Each of the first and second laminar circuit protection devices comprises a laminar PTC resistive element which exhibits PTC behavior, i.e. shows a sharp increase in resistivity with temperature over a relatively small temperature range. In this application, the term "PTC" is used to mean a composition or device which has an $R_{14}$ value of at least 2.5 and/or an $R_{100}$ value of at least 10, and it is preferred that the composition or device should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range. Generally the compositions used in devices of the invention show increases in resistivity which are much greater than those minimum values.

The resistive element may be composed of conductive polymer, i.e. a composition comprising a polymer and, dispersed, or otherwise distributed, therein, a particulate conductive filler, or a ceramic, e.g. a doped barium titanate. The PTC compositions used in the present invention are preferably conductive polymers which comprise a crystalline polymer component and, dispersed in the polymer component, a particulate filler component which comprises a conductive filler, e.g. carbon black or a metal. The filler component may also contain a non-conductive filler, which changes not only the electrical properties of the conductive polymer but also its physical and/or thermal properties. The crystalline polymer component may comprise two or more different polymers. The composition can also contain one or more other components, e.g. an antioxidant, crosslinking agent, coupling agent or elastomer. The PTC composition preferably has a resistivity at 23° C. of less than 50 ohm-cm, particularly less than 10 ohm-cm, especially less than 5 ohm-cm, more especially less than 2 ohm-cm. Suitable conductive polymers for use in this invention are disclosed for example in U.S. Pat. Nos. 4,237,441 (van Konynenburg et al), 4,304,987 (van Konynenburg), 4,388,607 (Toy et al), 4,514,620 (Cheng et al), 4,534,889 (van Konynenburg et al), 4,545,926 (Fouts et al), 4,560,498 (Horsma et al), 4,591,700 (Sopory), 4,724,417 (Au et al), 4,774,024 (Deep et al), 4,935,156 (van Konynenburg), 5,049,850 (Evans et al), 5,378,407 (Chandler et al), 5,451,919 (Chu et al), and 5,582,770 (Chu et al), and in copending, commonly assigned U.S. applications Ser. Nos. 08/789,962 (Wartenberg et al, filed Jan. 30, 1997), now U.S. Pat. No. 5,747,147, issued May 5, 1998, 08/798,887 (Toth et al, filed Feb. 10, 1997), 08/900,887 (Chu et al, filed Jul. 25, 1997), and 08/910,865 (Chandler et al, filed Aug. 13, 1997),now U.S. Pat. No. 5,801,612, issued Sep. 1, 1998. The disclosure of each of those patents and applications is incorporated herein by reference.

The PTC resistive element is a laminar element, and can be composed of one or more conductive polymer members, at least one of which is composed of a PTC material. When there is more than one conductive polymer member, the current preferably flows sequentially through the different compositions, as for example when each composition is in the form of a layer which extends across the whole device. When there is a single PTC composition, and the desired thickness of the PTC element is greater than that which can conveniently be prepared in a single step, a PTC element of the desired thickness can conveniently be prepared by joining together, e.g. laminating by means of heat and pressure, two or more layers, e.g. melt-extruded layers, of the PTC composition. When there is more than one PTC composition, the PTC element will usually be prepared by joining together, e.g. laminating by means of heat and pressure, elements of the different compositions. For example, a PTC element can comprise two laminar elements composed of a first PTC composition and, sandwiched between them, a laminar element composed of a second PTC composition having a higher resistivity than the first.

The resistive elements of the first and second circuit protection devices can comprise different conductive polymer compositions. For example, the compositions of the first and second circuit protection devices may vary by the use of different polymers, which may result in different switching temperatures (i.e. the temperature at which the device switches from a low resistance to a high resistance state); different fillers, which may affect the thermal and/or electrical properties of the device; or different resistivities.

Laminar Electrodes

The first and second laminar circuit protection devices each comprise a first laminar electrode and a second laminar electrode. The first face of the PTC resistive element is secured to the first electrode, and the opposite second face of the PTC resistive element is secured to the second electrode, and first and second apertures which run between the first and second faces are defined. The electrodes may be secured directly to the resistive element or attached by means of an adhesive or tie layer. Particularly suitable foil electrodes are microrough metal foil electrodes, including in particular electrodeposited nickel foils and nickel-plated electrodeposited copper foil electrodes, in particular as disclosed in U.S. Pat. Nos. 4,689,475 (Matthiesen) and 4,800,253 (Kleiner et al), and in copending, commonly assigned U.S. application Ser. No. 08/816,471 (Chandler et al, filed Mar. 13, 1997), the disclosure of each of which is incorporated herein by reference. The electrodes can be modified so as to produce desired thermal effects.

Third and Fourth Laminar Conductive Members

Each of the first and second circuit protection devices comprises a third laminar conductive member which is secured to the second face of the PTC resistive element in the area of the first aperture and is spaced apart from the second electrode, and a fourth laminar conductive member which is secured to the first face of the PTC resistive element in the area of the second aperture and is spaced apart from the first electrode.

The third and fourth laminar conductive members are preferably residual members formed by removing part of a laminar conductive member, the remainder of one laminar conductive member which forms the third laminar conductive member then being the second electrode, and the remainder of one laminar conductive member which forms the fourth laminar conductive member then being the first electrode. The shape of the third and fourth members, and the shape of the gap between the third member and the second electrode and the gap between the fourth member and the first electrode, can be varied to suit the desired characteristics of the device and for ease of manufacture. Thus the third member is conveniently a small rectangle at one end of a rectangular device, separated from the second electrode by a rectangular gap, and the fourth member is conveniently a small rectangle at one end of a rectangular device, separated from the first electrode by a rectangular gap. Alternate configurations are possible, and the shape of the third member and its associated gap can be the same as, or different from, that of the fourth member and its associated gap.

Apertures and Transverse Conductive Members

The laminar PTC resistive element defines first and second apertures which run between the first and second faces. The term "aperture" is used herein to denote an opening which, when viewed at right angles to the plane of the device, (a) has a closed cross section, e.g. a circle, an oval, or a generally rectangular shape, or (b) has a reentrant cross section, the term "reentrant cross section" being used to denote an open cross section which (i) has a depth at least 0.15 times, preferably at least 0.5 times, particularly at least 1.2 times, the maximum width of the cross section, e.g. a quarter circle or a half circle or an open-ended slot, and/or (ii) has at least one part where the opposite edges of the cross section are parallel to each other.

For ease of electrical connection and inspectability, it is preferred that at least one and preferably both of the apertures have an open cross section, and are located at the edge of the resistive element. For example, if the first and second laminar circuit protection devices are made by an assembly of the type described in application Ser. No. 08/121,717, i.e. one which can be divided into a plurality of electrical devices, the apertures will normally be of closed cross section, but if one or more of the lines of division passes through an aperture of closed cross section, then the apertures in the resulting devices will then have open cross sections. It is important that any such open cross section is a reentrant cross section as defined above, in order to ensure that any transverse conductive member, as described below, is not damaged or dislodged during installation or use of the device.

The aperture can be a circular hole, and for many purposes this is satisfactory in both individual devices and assemblies of devices. However, if the assembly includes apertures which are traversed by at least one line of division, elongate apertures may be preferred because they require less accuracy in the lines of division.

Each of the first and second laminar circuit protection devices comprises (a) a first transverse conductive member which lies within the first aperture, runs between the first and second faces of the PTC element, is secured to the PTC element, and is physically and electrically connected to the first laminar electrode and to the third laminar conductive member, but is not connected to the second laminar electrode, and (b) a second transverse conductive member which lies within the second aperture, runs between the first and second faces of the PTC element, is secured to the PTC element, and is physically and electrically connected to the second laminar electrode and to the fourth laminar conductive member, but is not connected to the first laminar electrode. The first and second transverse conductive members are also known as cross-conductors.

When the aperture is not traversed by a line of division, it can be as small as is convenient for a transverse member having the necessary current-carrying capacity. For circuit protection devices, holes of diameter 0.1 to 5 mm, preferably 0.15 to 1.0 mm, e.g. 0.2 to 0.5 mm, are generally satisfactory. Although for some applications, a single transverse member is all that is needed to make an electrical connection to the first electrode from the opposite side of the device, the first and second laminar circuit protection devices of the invention comprise two or more transverse members to make this connection. The number and size of the transverse members, and, therefore, their thermal capacity, can have an appreciable influence on the rate at which the composite circuit protection device will trip into its high resistance state.

The apertures can be formed before the transverse members are put in place, or the formation of the apertures and the placing of the transverse members can be carried out simultaneously. A preferred procedure is to form the apertures, e.g. by drilling, slicing or any other appropriate technique, and then to plate or otherwise coat or fill the interior surface of the apertures. The plating can be effected by electroless plating, or electrolytic plating, or by a combination of both. The plating can be a single layer or multiple layers, and can be composed of a single metal or a mixture of metals, in particular a solder. The plating will often also be formed on other exposed conductive surfaces of the assembly. If such plating is not desired, then the other exposed conductive surfaces must be masked or otherwise desensitized. Generally, however, the plating is carried out at a stage of the process at which such additional plating will not produce an adverse effect. In some embodiments, it is possible that the plating will produce not only the transverse members but also at least part of the laminar conductive members in the device.

The plating techniques which are used for making conductive vias through insulating circuit boards can be used in the present invention. However, in this invention the plating serves merely to convey current across the device, whereas a plated via must make good electrical contact with another component. Consequently, the plating quality required in this invention may be less than that required for a via.

Another technique for providing the transverse members is to place a moldable or liquid conductive composition in preformed apertures, and if desired or necessary to treat the composition, while it is in the apertures, so as to produce transverse members of desired properties. The composition can be supplied selectively to the apertures, e.g. by means of a screen, or to the whole assembly, if desired after pretreating at least some of the assembly so that the composition does not stick to it. For example, a molten conductive composition, e.g. solder, could be used in this way, if desired using wave soldering techniques.

The transverse members can also be provided by a preformed member, e.g. a metal rod or tube, for example a rivet. When such a preformed member is used, it can create the aperture as it is put in place in the device.

The transverse members can partially or completely fill the apertures. When the apertures are partially filled, they can be further filled (including completely filled) during the process in which the device is connected to other electrical components, particularly by a soldering process. This can be encouraged by providing additional solder in and around the apertures, especially by including a plating of solder in and around the apertures. Normally at least a part of the transverse members will be put in place before the device is connected to other electrical components. However, for some embodiments, the transverse members are formed during a connection process, as for example by the capillary action of solder during a soldering process.

Laminar Insulating Member

The first and second laminar circuit protection devices are physically secured together in a stacked configuration, with a laminar insulating member between them. The insulating member can comprise a solid, non-conductive material, e.g. a polyester, of the type described in U.S. application Ser. No. 08/242,916, which also serves to prevent solder bridges between the conductive member and the adjacent electrode. Alternatively or in addition, the insulating member can comprise an electrically nonconductive adhesive, e.g. an epoxy or hot-melt adhesive, to which fillers can be added to achieve particular thermal effects. For most applications, the insulating member has a resistivity of at least $10_6$, preferably at least $10_9$ ohm-cm. However, for some embodiments, the insulating member may be itself conductive, as long as it has a resistivity at 23° C. of at least $10_4$, preferably at least $10_5$, particularly at least $10_6$ times that of the PTC conductive polymer. (If the first and second circuit protection devices comprise different conductive polymers, the resistivity of the insulating member is compared to the resistivity of the higher-resistivity device.) For these embodiments, under normal operating conditions, little, if any, of the current is carried by the insulating member, but when the device is tripped into the high resistance state, the insulating member can carry a significant proportion of the current. The insulating member can be relatively small, covering only a small amount of space, or it can cover substantially all of the surface of the first and/or second laminar circuit protection device. It can be a dielectric layer onto which marking can be applied.

Interfacial Electrical Connections

Figure 8:
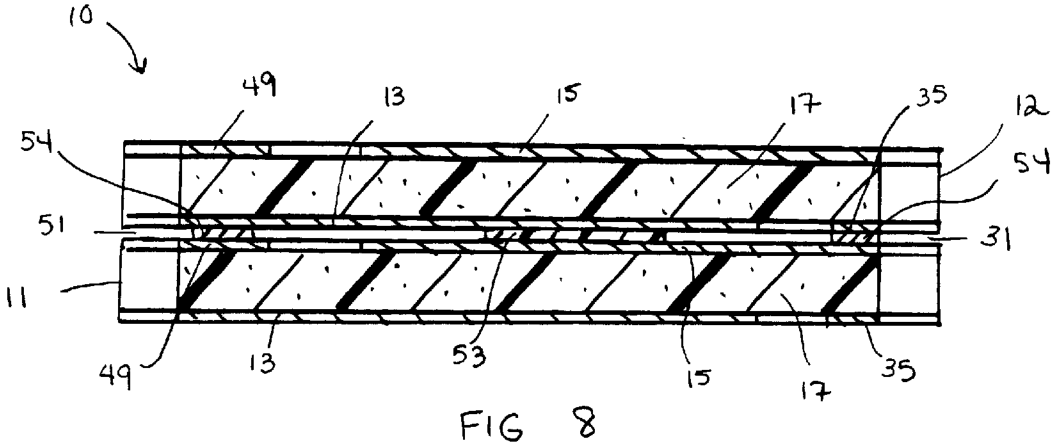
FIG. 8 is a cross sectional view along line 8—8 of the device of FIG. 7.
Figure 9:
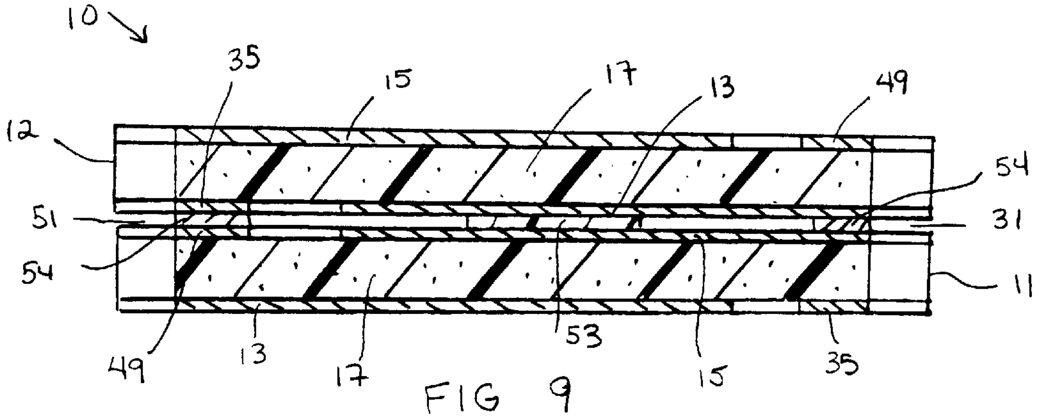
FIG. 9 is a cross sectional view of another composite circuit protection device of the invention.

The first and second laminar circuit protection devices are stacked together in a way which allows the devices to be electrically connected in parallel to form the composite device. This connection is achieved in such a way that when an electrical power supply is connected to (i) one of the electrodes and (ii) the third or fourth laminar member on the same face of the PTC resistive element as the electrode (i), the first and second laminar circuit devices are connected in parallel. The electrical connection is an interfacial electrical connection. In this specification, the term "interfacial" means the connection made between opposed surfaces of different devices. Thus, for example, as shown in FIG. 8, if the first laminar circuit protection device of the composite device is attached to the substrate, e.g. a printed circuit board, by means of second laminar electrode and third laminar conductive member, the fourth conductive member and the first laminar electrode can be connected via an interfacial electrical connection to the opposed second laminar electrode and third laminar conductive member, respectively, of the second circuit protection device. Alternatively, as shown in FIG. 9, the fourth laminar conductive member and the first laminar electrode of the first circuit protection device are connected via an interfacial connection to the third laminar conductive member and the second laminar electrode, respectively, of the second circuit protection device. Depending on how the devices are stacked to form the composite device, the gaps between the electrode and the laminar member of adjacent stacked devices may overlap or be aligned.

Although the material used to make the interfacial connection can be any suitable electrically conductive material, it is preferred that the interfacial connections be solder joints. When the device is designed to be solder reflowed onto a substrate, it is possible to make the interfacial connections from a first solder, and using a second solder, which has a higher reflow temperature than the first solder, on exposed surfaces of the first and/or second electrodes and the third and/or fourth laminar members. Thus, when the device is attached to the substrate, the solder reflowing operation will not cause the device to separate at the interfacial connections.

Devices

Devices of the invention have low resistance at 23° C., generally less than 10 ohms, preferably less than 5 ohms, more preferably less than 1 ohm, particularly less than 0.5 ohm, especially less than 0.1 ohm, with yet lower resistance being possible, e.g. less than 0.5 ohm.

An advantage of the present invention is that several circuit protection devices may be stacked together to produce a composite device having an even lower resistance. For ease of manufacture, it is preferred that the devices be substantially identical, although for some applications, it is possible to use devices of different configurations, e.g. a device of a different thickness can be stacked between two identical devices. For composite devices comprising more than two circuit protection devices, it is preferred that there are p substantially identical laminar circuit protection devices, where p is 3 or more, and (p−1) laminar insulating members. It is preferred that these substantially identical laminar circuit protection devices be symmetrical. Such symmetrical devices, when stacked, allow the attachment of the composite device to the substrate with either side up.

The devices of the invention can be of any appropriate size. However, it is an important advantage that very small devices can be easily prepared. Preferred devices have a maximum dimension of at most 12 mm, preferably at most 7 mm, and/or a footprint (surface area) on the substrate, as viewed at a right angle to the plane of the composite device, of at most 30 $mm^2$, preferably at most 20 $mm^2$, especially at most 15 $mm^2$.

Processes

The devices of the invention containing cross-conductors can be prepared in any way. However, it is preferred to prepare devices by carrying out all or most of the process steps on a large laminate, and then dividing the laminate into a plurality of individual devices, or into relatively small groups of devices which are connected together physically and which may be connected to each other electrically, in series or in parallel or both. The division of the laminate can be carried out along lines which pass through one or both or neither of the laminar conductive members or through none, some or all of the cross-conductors. The process steps prior to division can in general be carried out in any convenient sequence. Preferred processes for making the devices are disclosed in U.S. patent application Ser. No. 08/242,916, abandoned in favor of continuation application Ser. No. 08/710,925, now U.S. Pat. No. 5,820,510, and Ser. No. 08/257,586, abandoned in favor of continuation application Ser. No. 08/808,135, now U.S. Pat. No. 5,864,281, the disclosures of which are incorporated by reference herein.

Composite devices of the invention can also be made by a process in which a batch of laminar circuit protection devices is sorted into a plurality of sub-batches, each sub-batch containing devices having a resistance within a certain range. Composite devices are then prepared by physically and electrically connecting laminar devices from one of said sub-batches. This allows preparation of devices within a tight resistance window, and minimizes variation among the devices.

Drawings

Figure 2:
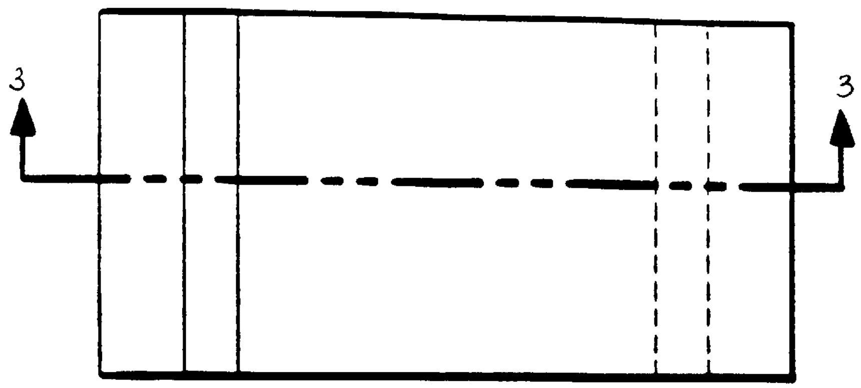
FIGS. 2 and 3 are plan and cross sectional views of the device of FIG. 1 mounted on a printed circuit board parallel to the board.
Figure 3:
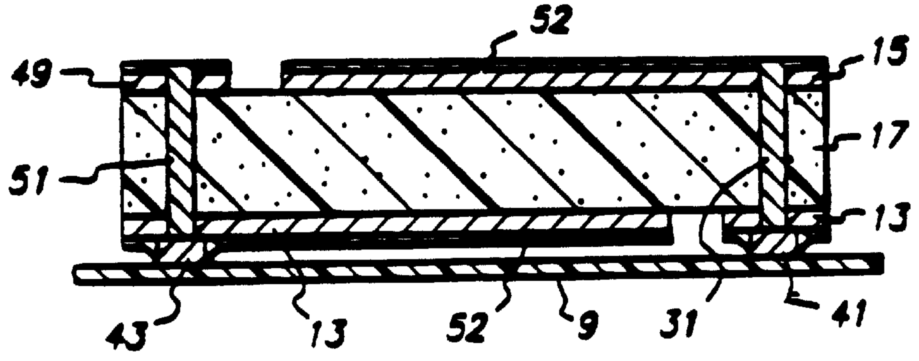

The invention is illustrated in the accompanying drawings, in which the size of the apertures and the thickness of the components have been exaggerated in the interests of clarity. FIG. 1 is a perspective view of a laminar circuit protection device suitable for use as either the first or the second circuit protection device in a composite device of the invention. FIG. 2 is a plan view of the device of FIG. 1 mounted on a printed circuit board, and FIG. 3 is a cross section on line 3—3 of FIG. 2. The device includes a laminar PTC element 17 having a first face to which first laminar electrode 13 and fourth conductive member 35 are attached and a second face to which second laminar electrode 15 and third conductive member 49 are attached. The device is symmetrical so that it can be placed on a circuit board either way up. First transverse conductive member 51 lies within an aperture defined by first electrode 13, PTC element 17 and third conductive member 49. Second transverse conductive member 31 lies within an aperture defined by second electrode 15, PTC element 17, and fourth conductive member 35, thus connecting second electrode 15 to fourth conductive member 35. Both first and second transverse members 51 and 31 are hollow tubes formed by a plating process in which the exposed surfaces were plated first with copper and then with solder. This process results in a plating 52 on the surfaces of the device which were exposed during the plating process. The device has been soldered to traces 41 and 43 on an insulating substrate 9. During the soldering process the solder plating on the device flows and completely fills the apertures.

Figure 4:
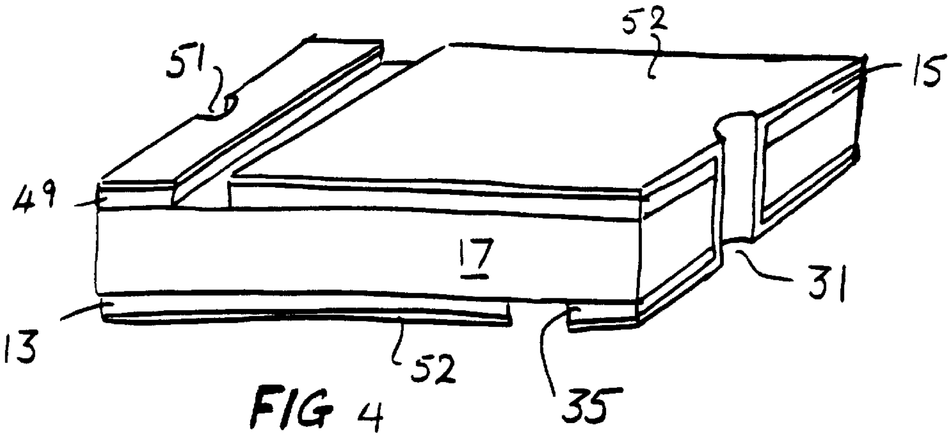
FIG. 4 is a perspective view of another laminar circuit protection device suitable for use in a composite circuit protection device of the invention.

FIG. 4 is a perspective view of a device which is similar to that shown in FIGS. 1 to 3, but in which each of the apertures has an open cross section which is a half circle.

Figure 5:
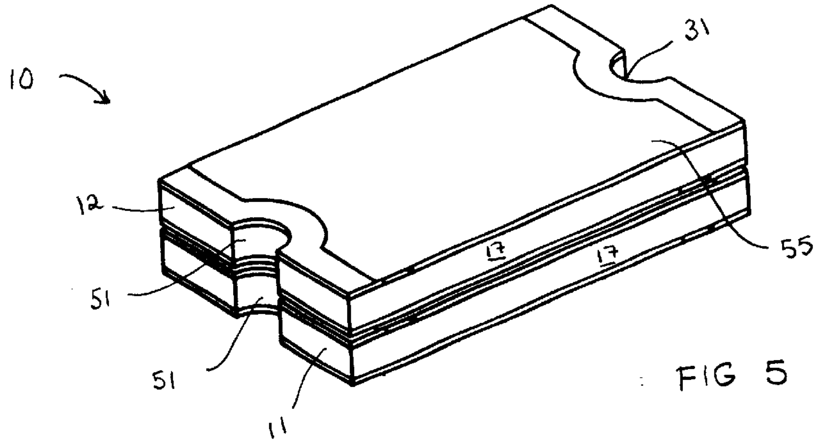
FIG. 5 is a perspective view of a composite circuit protection device of the invention.
Figure 6:
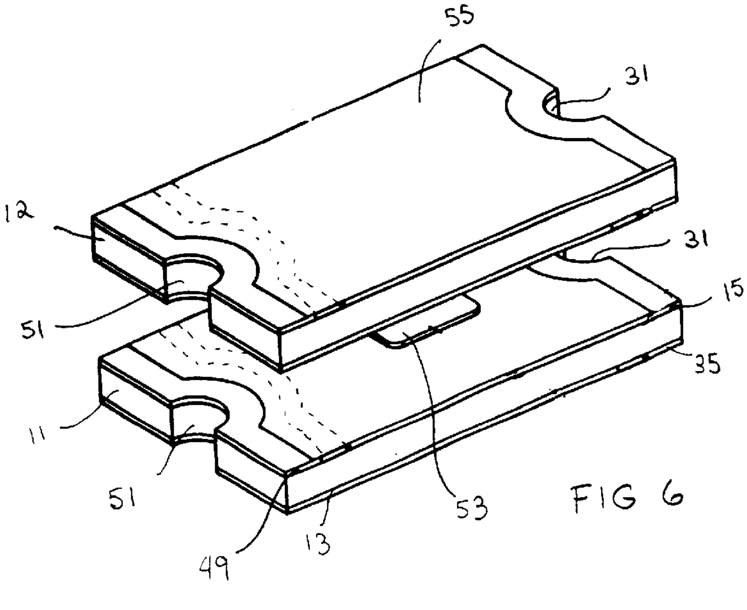
FIG. 6 is an exploded perspective view of the device of FIG. 5.

FIG. 5 is a perspective view of composite circuit protection device 10 of the invention, and FIG. 6 shows that composite device in an exploded view. First laminar circuit protection device 11 is attached via insulating member 53 to second circuit protection device 12. Dielectric layer 55 covers most of the top surface of device 10. Shown in dotted lines in FIG. 6 is the gap between third conductive member 49 and second electrode 15, which lies under dielectric layer 55 and is more clearly shown in FIG. 8.

Figure 7:
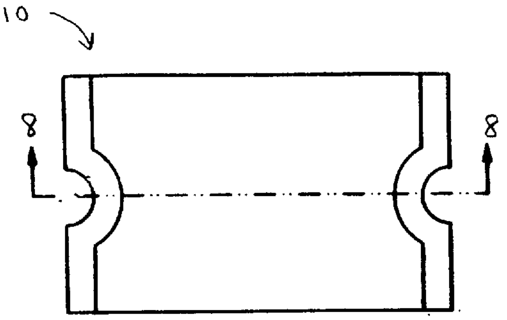
FIG. 7 is a plan view of the device of FIG. 5.

FIG. 7 is a plan view of the device of FIG. 5, and FIG. 8 is a cross sectional view along line 8—8 of FIG. 7 (not showing dielectric layer 55). Interfacial connections 54 connect third conductive member 49 of first circuit protection device 11 to first electrode 13 of second circuit protection device 12, and connect second electrode 15 of first circuit protection device 11 to fourth conductive member 35 of second circuit protection device 12. In this embodiment, the gaps between the conductive member and the electrode of the respective first and second devices 11, 12 are offset from one another.

FIG. 9 shows a cross section similar to FIG. 8, but in this composite device, the gap between second electrode 15 and third conductive member 49 of first device 11 is aligned with the gap between fourth conductive member 35 and first electrode 13 of second device 12.

All embodiments and aspects of the invention set out above are to be regarded as part of Applicants' invention, even where the detailed description is broader than the summary of the invention set out above. Conversely, the detailed description should not be regarded as in any way limiting the generality of the summary of the invention set out above. In addition, as described above and claimed below, and as illustrated in the accompanying drawings, the present invention can make use of a number of particular features. Where such feature is disclosed in a particular context or as part of a particular combination, it can also be used in other contexts and in other combinations, including for example other combinations of two or more such features.

What is claimed is:

1. A composite circuit protection device comprising (I) a laminar insulating member;

(II) a first laminar circuit protection device; and (III) a second laminar circuit protection device; each of the first and second laminar circuit protection devices comprising (1) a first laminar electrode;

(2) a second laminar electrode;

(3) a laminar PTC resistive element which (i) exhibits PTC behavior, (ii) has a first face to which the first electrode is secured and an opposite second face to which the second electrode is secured, (iii) defines first and second apertures which run between the first and second faces, and (iv) is composed of a PTC conductive polymer;

(4) a third laminar conductive member which (i) is secured to the second face of the PTC resistive element in the area of the first aperture, and (ii) is spaced apart from the second electrode;

(5) a fourth laminar conductive member which (i) is secured to the first face of the PTC resistive element in the area of the second aperture, and (ii) is spaced apart from the first electrode;

(6) a first transverse conductive member which (a) lies within the first aperture defined by the PTC resistive element, (b) runs between the first and second faces of the PTC element, (c) is secured to the PTC element, and (d) is physically and electrically connected to the first laminar electrode and to the third laminar conductive member, but is not connected to the second laminar electrode; and (7) a second transverse conductive member which
(a) lies within the second aperture defined by the PTC resistive element,
(b) runs between the first and second faces of the PTC element,
(c) is secured to the PTC element, and
(d) is physically and electrically connected to the second laminar electrode and to the fourth laminar conductive member, but is not connected to the first laminar electrode;

the first and second laminar devices being physically secured together in a stacked configuration, with the laminar insulating member between them; the devices being connected together electrically by interfacial electrical connections which are solder joints composed of a first solder and are between (A) a third or fourth member of the first laminar device and a first or second electrode of the second laminar device, and (B) a third or fourth member of the second laminar device and a first or second electrode of the second laminar device so that when an electrical power supply is connected to (i) one of the electrodes and (ii) the third or fourth laminar member on the same face of the PTC resistive element as the electrode (i), the first and second laminar circuit protection devices are connected electrically in parallel;

the composite device (1) being capable of flat connection onto a substrate free of leads, and (2) further comprising layers of a second solder on exposed surfaces of the first or second electrodes and the third and fourth laminar members, the second solder being reflowable at temperatures which do not melt the solder joints.

2. A composite device according to claim 1 wherein the first and second laminar circuit protection devices have substantially identical shapes, thicknesses, and resistive elements.

3. A composite device according to claim 2 which is symmetrical so that it can be connected either way up on a printed circuit board.

4. A composite device according to claim 1 which comprises p substantially identical laminar circuit protection devices, where p is 3 or more; and (p−1) laminar insulating members; the laminar devices being (a) secured together physically in a stacked configuration, with one of the laminating insulating members between each pair of laminar devices, and (b) connected together electrically so that when an electrical power supply is connected to (i) one of the electrodes, and (ii) the third or fourth member on the same face of the PTC resistive element as the electrode (i), all the laminar circuit protection devices are connected together electrically in parallel.

5. A composite device according to claim 1 wherein the PTC conductive polymer has a resistivity at 25° C. of less than 5 ohm-cm.

6. A composite device according to claim 1 wherein the PTC conductive polymer of the first circuit protection device comprises a different polymer or different filler, or has a different resistivity from the PTC conductive polymer of the second circuit protection device.

7. A composite device according to claim 1 wherein the laminar insulating member comprises an electrically non-conductive adhesive.

8. A device according to claim 2 wherein the first and second electrodes and the third and fourth laminar conductive members are metal foils.

9. A device according to claim 8 wherein each of the first and second transverse conductive members comprises a plating of a metal on the surface of the PTC resistive element which defines the aperture.

10. A device according to claim 1 wherein each of the apertures has an open cross section.

11. A device according to claim 1 wherein each of the first and second apertures has a cross section which is a half circle.

12. A device according to claim 1 wherein each of the first and second apertures has a cross section which is a quarter circle.

13. A device according to claim 1 which has a footprint of at most 20 $mm^2$.

* * * * *